(12) United States Patent
Müller et al.

(10) Patent No.: US 6,894,288 B2
(45) Date of Patent: May 17, 2005

(54) MANIPULATOR FOR AN OPTICAL OR PARTICLE-OPTICAL APPARATUS

(75) Inventors: Helmut Müller, Schwäbisch Gmünd (DE); Daniel Tobias, Oberkochen (DE)

(73) Assignee: LEO Elektronenmikroskopie GmbH, Oberkochen (DE)

( * ) Notice: Subject to any disclaimer, the term of this patent is extended or adjusted under 35 U.S.C. 154(b) by 0 days.

(21) Appl. No.: 10/394,201

(22) Filed: Mar. 24, 2003

(65) Prior Publication Data

US 2004/0094710 A1 May 20, 2004

(30) Foreign Application Priority Data

Mar. 22, 2002 (DE) .......................................... 102 12 807

(51) Int. Cl.[7] .......................... H01J 37/15; G02B 21/34
(52) U.S. Cl. .................... 250/443.1; 250/306; 250/310; 250/311; 250/440.11; 250/442.11
(58) Field of Search ............................. 250/443.1, 306, 250/310, 311, 440.11, 442.11, 492.1–492.3

(56) References Cited

U.S. PATENT DOCUMENTS

| | | | |
|---|---|---|---|
| 3,419,717 A | | 12/1968 | Cunningham |
| 4,591,722 A | | 5/1986 | Biddlecombe |
| 4,703,181 A | * | 10/1987 | Swann et al. .......... 250/442.11 |
| 5,077,637 A | * | 12/1991 | Martorana et al. .......... 361/717 |
| 5,220,171 A | * | 6/1993 | Hara et al. ............... 250/443.1 |
| 5,296,669 A | * | 3/1994 | Kobayashi et al. ......... 219/201 |
| 5,367,171 A | * | 11/1994 | Aoyama et al. .......... 250/443.1 |
| 5,898,177 A | * | 4/1999 | Hidaka et al. ............... 250/311 |
| 6,351,387 B1 | * | 2/2002 | Prasher ....................... 361/707 |
| 6,365,076 B1 | * | 4/2002 | Bhatia ......................... 264/105 |
| 2003/0193105 A1 | * | 10/2003 | Montgomery et al. ........ 264/69 |
| 2003/0222227 A1 | * | 12/2003 | Richards et al. ....... 250/492.21 |
| 2004/0094710 A1 | * | 5/2004 | Muller et al. ............... 250/306 |

FOREIGN PATENT DOCUMENTS

JP 55-134933 10/1980

* cited by examiner

*Primary Examiner*—John R. Lee
*Assistant Examiner*—Bernard E. Souw
(74) *Attorney, Agent, or Firm*—Walter Ottesen

(57) ABSTRACT

The invention is directed to a manipulator for an optical apparatus including a particle-optical apparatus. The manipulator is especially a diaphragm or specimen manipulator in an electron microscope. The component (4), which is to manipulated, is accommodated by a transfer body (2) movable relative to a spatially-fixed component (1) and the transfer body (2) includes a composite material having a high thermal conductivity while simultaneously having a vanishing or negative thermal expansion coefficient in the direction of the connecting axis (B—B) between the component (4) and the spatially-fixed component (1).

27 Claims, 3 Drawing Sheets

MANIPULATOR FOR AN OPTICAL OR PARTICLE-OPTICAL APPARATUS

FIELD OF THE INVENTION

The invention relates to a manipulator for an optical or particle-optical apparatus, especially to a diaphragm or specimen manipulator for an electron microscope. Such manipulators include, as a rule, a transfer element which is movable in two or three spatial directions relative to a component accommodated on the apparatus housing. The transfer element carries the component to be manipulated at one end thereof. The component to be manipulated can, for example, be a diaphragm. Energy is continuously supplied to the component to be manipulated because of the incident radiation and this causes a warming of this component. For this reason, the transfer element, as a rule, is made of metal in order to conduct the heat toward the housing.

BACKGROUND OF THE INVENTION

Corresponding manipulators for diaphragms or multiple diaphragms are, for example, known from the transmission electron microscopes LEO 912 or LEO 922 manufactured and sold by LEO Elektronenmikroskopie GmbH of Oberkochen, Germany. From Japanese patent application 86-048248, it is known to produce a diaphragm for an electron microscope having multiple layers of an inner hard metal and an external layer of metal surrounding the hard metal. The metal surrounding the hard metal has a high thermal conductivity.

Notwithstanding the use of thermally high conducting transfer elements, thermal drifts nonetheless occur because of the remaining heating and the thermal expansion of the components of the manipulator associated therewith, especially when the energy flow incident on the diaphragms varies. This leads to the situation that the position of the switched-in diaphragms must be readjusted after a change of the energy flow.

SUMMARY OF THE INVENTION

In view of the foregoing, it is an object of the invention to provide a manipulator which does not exhibit thermal drifts of the component to be manipulated or only very reduced thermal drifts.

The manipulator of the invention is for manipulating a component in an optical or particle-optical apparatus and includes: a spatially-fixed part; a transfer body accommodating the component and being mounted so as to be movable relative to the spatially-fixed part; the spatially-fixed part and the component conjointly defining a connecting axis; the transfer body containing a thermally anisotropic composite material having a first thermal conductivity in a first direction and a second thermal conductivity in a second direction and the first thermal conductivity being higher than the second thermal conductivity; and, the composite material being disposed in the transfer body so that the first direction of the first thermal conductivity is aligned in the direction of the connecting axis.

In the manipulator of the invention, the component to be manipulated is accommodated by a transfer body movable relative to a spatially fixed component. However, the transfer body includes a thermally anisotropic composite material. The direction of the larger thermal conductivity is aligned in the direction of the connecting axis between the component to be manipulated and the spatially-fixed component.

The heat which is generated in the component, which is to be manipulated, can be conducted away very efficiently to the spatially-fixed component because of the high thermal conductivity at least in the direction of the connecting axis between the component, which is to be manipulated, and the spatially-fixed component.

At the same time, the transfer body should exhibit a vanishing or negative thermal expansion coefficient in the direction of the connecting axis. Due to the vanishing or even negative thermal expansion coefficient in the direction of the connecting axis between the component to be manipulated and the spatially-fixed component, the remaining thermal expansion (and therefore the remaining thermal drift) is held very low and, for negative thermal expansion coefficients, a remaining thermal expansion of other components is partially compensated by the transfer body.

Preferably, a fiber-reinforced pitch-based orientated graphite is a material suitable for the composite material. The fibers can be carbon fibers. Such materials are, for example, available in the marketplace from BP Amoco Polymers Inc. under the product designation "Thermal-Graph" having the types: 6000X, 7000X and 8000X.

The thermal conductivity in the direction of the connecting axis between the component to be manipulated and the component to be accommodated on the housing should be greater than the thermal conductivity of copper, that is, the thermal conductivity should be greater than 378 W/mK and preferably greater than 600 W/mK.

The invention is based especially on the recognition that a thermal anisotropic material can be used for the transfer body when only a sufficient thermal conductivity is ensured in the direction of the connecting axis between the component to be manipulated and the component to be accommodated on the housing and that the significantly lower thermal conductivity in the direction perpendicular thereto is not disturbing. The low thermal conductivity perpendicular to the connecting axis between the component to be manipulated and the spatially-fixed component then leads to the condition that the thermal expansion in the direction of the connecting axis can be negative. This low thermal conductivity is comparable to the low thermal conductivity of a thermal insulator having simultaneously a relatively high thermal expansion coefficient perpendicular to the connecting axis. As a consequence of the above, the fiber direction of the composite material should be aligned in the direction of the connecting axis between the component to be manipulated and the spatially-fixed component.

One end of the transfer body should be provided with an inclined surface for the efficient heat transfer from the component to be manipulated to the transfer body. The inclined surface should be inclined to the direction of the connecting axis between the component to be manipulated and the spatially-fixed component. The component to be manipulated should be accommodated on this inclined surface with a surface contact. A considerable optimization of the surface, which is utilized for heat transfer, is obtained with the inclined surface.

A further component should be provided for conducting away the heat from the transfer body to the spatially-fixed component and therefore to the apparatus housing or the ambient. The transfer body should be in surface contact with the further component at the end lying opposite to the inclined surface.

Furthermore, a metal sleeve can be provided which surrounds the transfer body at least over portions thereof. With the aid of such a metal sleeve, the occurring mechanical problems are solved which would otherwise occur because of the relatively poor capability of the material of the transfer body to withstand mechanical load.

The manipulator should have a vacuum seal and the transfer body should be guided through the vacuum seal. This seal should be provided especially for manipulators in particle beam apparatus such as electron microscopes or other apparatus having ionizing radiation wherein the conduction of radiation takes place in the vacuum. The conducting in and away of the heat from the transfer body or from a further body to the apparatus housing or into the ambient can take place via the air outside of the vacuum region. The further component is in surface contact with the transfer body.

A tilt joint for the transfer body can be provided in the region of the vacuum seal so that the transfer body has the degrees of freedom for the movement of the component to be manipulated.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
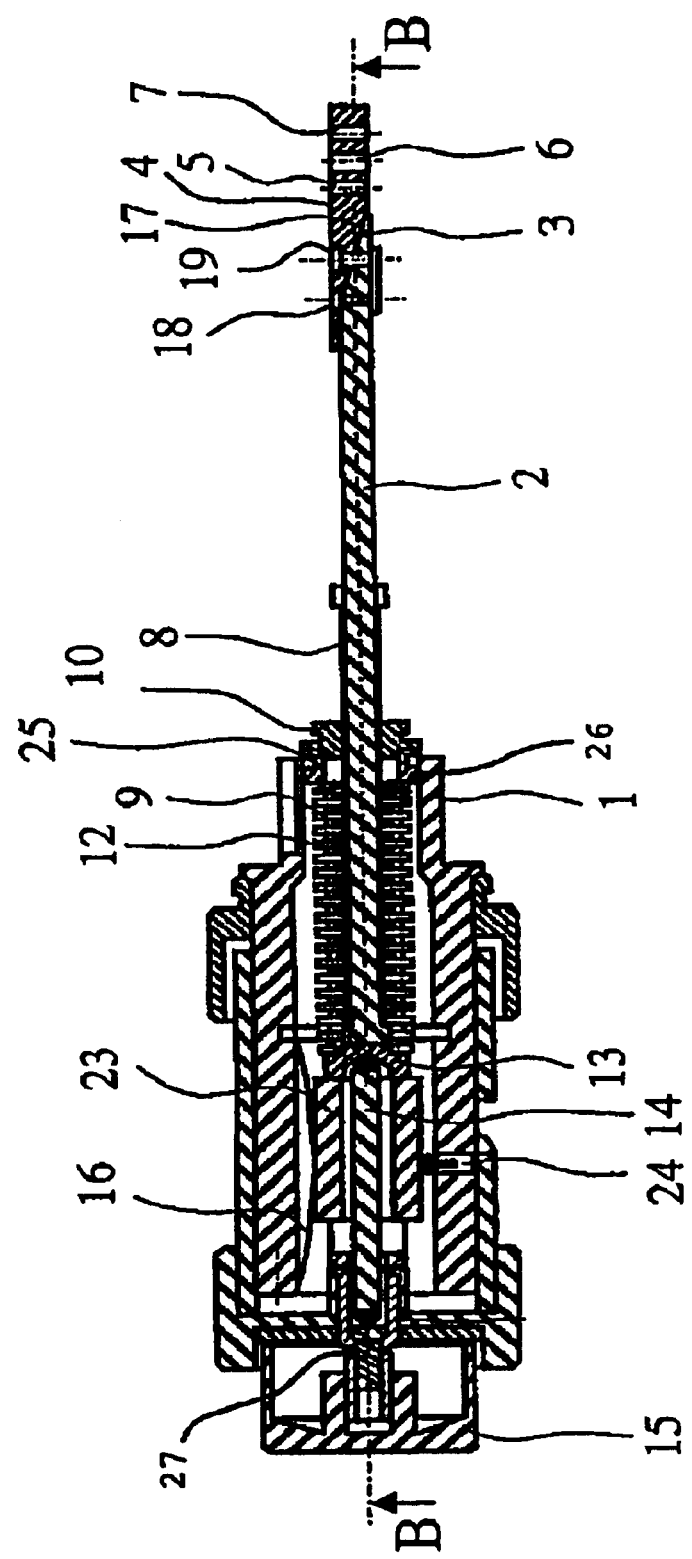
FIG. 1 is a section view through a manipulator of the invention and is shown here by way of example for a manipulator in the form of a diaphragm holder.
Figure 2:
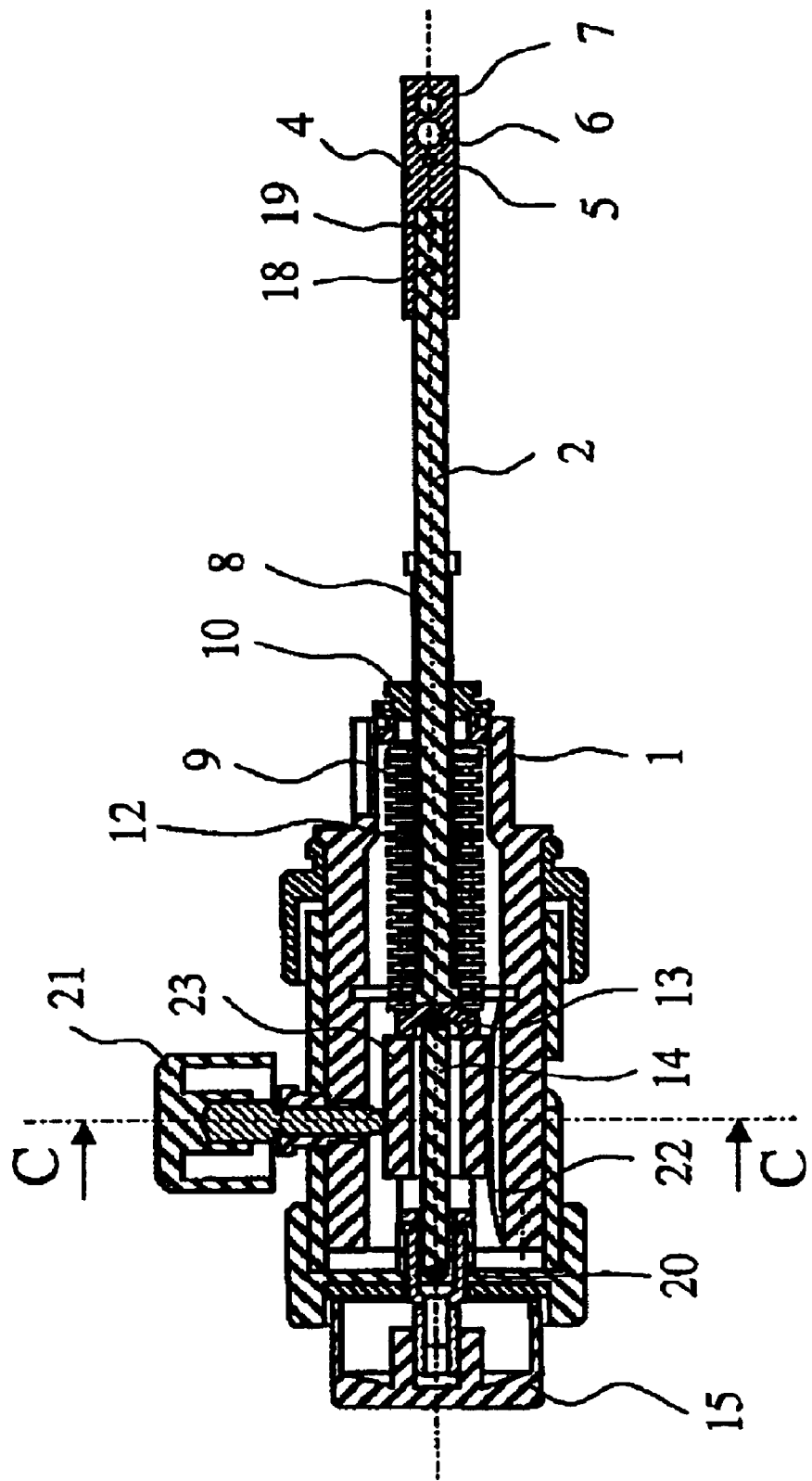
FIG. 2 is a section view taken through the manipulator of FIG. 1 in a section plane perpendicular to FIG. 1; and, FIG. 3 is a detail view of a portion of a transmission electron microscope incorporating a manipulator of the invention in the form of a diaphragm holder.

The manipulator shown in FIGS. 1 and 2 has a frame part 1 made of metal with which it can be accommodated on the wall of an apparatus housing, for example, the vacuum column of an electron microscope. A rod-shaped transfer element 2 made of carbon-fiber composite material is movably accommodated in the frame part 1. On the end facing away from the frame part 1, the transfer body 2 carries the component to be manipulated and, in the embodiment shown, this component is a diaphragm carrier 4 having three diaphragms (5, 6, 7) of different diameters arranged thereon.

The material of the transfer body 2 is a carbon-fiber reinforced orientated graphite such as offered, for example, by the BP Amoco Polymers Inc. under the product designation "ThermalGraph 8000X". This material has strong anisotropic thermal characteristics and is highly thermally conductive in the fiber direction with a thermal conductivity of 800 W/mK. In contrast, in the direction perpendicular to the fiber direction, the thermal conductivity is weak with a thermal conductivity of 20 W/mk. At the same time, the material has, in the fiber direction, a negative thermal expansion coefficient of −1.7 ppm/° C. so that the transfer body shrinks with a warming at least in the fiber direction.

Because of the anisotropic thermal characteristics of the transfer body, the material thereof is so orientated that the fiber direction of the composite material is coincident with the direction of the connecting axis (B—B) between the component 4 to be manipulated and the component 1 to be accommodated on the housing.

The transfer body 2 has an inclined surface 3 on that end thereof whereat the component to be manipulated is accommodated in order to achieve a good thermal coupling between the component 4 to be manipulated and the transfer body 2. More specifically, the end of the transfer body 2 is beveled and this end and the connecting axis (B—B) conjointly define an acute angle of less than 45°. The connecting axis (B—B) is between the component 4 to be manipulated and the component 1 to be accommodated on the housing. The component 4 to be manipulated has a corresponding inclined surface 17. The transfer body 2 and the component 4 to be manipulated are connected to each other with screws (18, 19) perpendicular to the connecting axis (B—B). In lieu of a threaded connection perpendicular to the connecting axis (B—B), a threadable connection perpendicular to the inclined surfaces (3, 17) is also possible. With the inclined surface 3 on the transfer body 2, an enlarged surface is thereby provided via which heat is coupled into the transfer body in the direction of the higher thermal conductivity, that is, in the direction of the fibers. At the same time, a good thermal coupling and a surface connection is obtained between the transfer body 2 and the component 4 to be manipulated via the screw connection.

The transfer body 2 is fixedly accommodated in a metal sleeve 8 on the end facing away from the component 4 to be manipulated. This metal sleeve B serves, on the one hand, to take up the forces perpendicular to the fiber direction of the transfer body 2 and, on the other hand, to connect the transfer body 2 at the end, which lies opposite to the component 4 to be manipulated, with its end face in surface contact with a further component 23. These forces are generated by the manipulator linkages to be described in detail hereinafter. For the above purpose. the metal sleeve 8 has a flange with a cap-type nut 13 on the end which lies opposite to or away from the component 4 to be manipulated. A component 23 is held in surface contact with the end face of the transfer body 2 by the cap-type nut.

Heat is coupled into the transfer body and is transported in fiber direction to the end face of the transfer body. This heat is coupled via the end face into the additional component 23 and is conducted further to the frame part 1 via the air and the leaf springs (16, 22) and via a bone-shaped component 14 accommodated in the interior of the metal sleeve. It is necessary that the additional component 23 lie outside of the vacuum region so that conducting away heat via the air can take place. For this reason, the vacuum seal is in the region of the transfer body 2.

The metal sleeve 8 is movably journalled with a tilt joint 10 on the frame part 1. In the interior of the frame part 1, the metal sleeve 8 is surrounded by a spiral pressure spring 9 which, in turn, is surrounded by a metal bellows 12. The spiral pressure spring 9 serves to generate a return force in the direction of the connecting axis (B—B) between the component 4 to be manipulated and the component 1 accommodated on the housing. The spring 9 and the bellows 12 are shown in positions they assume during assembly of the manipulator. In the assembled state, the spring 9 is braced against the part 26 holding the tilt joint 10 and the bellows 12 is connected to the seal ring 25.

The fine adjustment of the component 4 in the direction of the connecting axis (B—B) takes place via an operator-controlled knob 15 which threadably engages a screw 27 and this screw 27 is displaced along the connecting axis (B—B) when the knob is rotated. The screw 27 takes up the thrust component 14 in a recess formed in the forward end of the screw. For a rotation of the operator-controlled knob 15, the thrust component 14 and, via the thrust component 14, the transfer body 2, in turn, is displaced in the direction of the connecting axis (B—B) against the force of the spiral pressure spring 9 for an out-rotation of the screw 27 (expanding). On the other hand, for a rotation of the screw 27, which results in a shortening, the spiral pressure spring 9 presses the metal sleeve 8 in the direction toward the operator-controlled knob 15.

Two additional adjusting screws (21, 24) are provided for manipulating the diaphragms (5, 6, 7) perpendicular to the direction of the connecting axis (B—B). The adjusting screws (21, 24) are accommodated on the frame part 1 perpendicularly to the direction of the connecting axis (B—B) and each press on the component 23 which surrounds the thrust component 14. To generate respective return forces, two leaf springs (16, 22) are mounted between the frame part 1 and the component 23. The leaf springs (16, 22) generate the respective return forces with a deflection of the component 23 and these return forces are perpendicular to each other.

In order to switch one of the three diaphragm openings (5, 6, 7) into the beam path, a stepped drive having a latch is integrated into the frame part 1. With a switching by a step, the diaphragm carriage is moved by a distance in the direction of the connecting axis (B—B) which corresponds to the distance between the center points of each two diaphragm openings (5, 6, 7).

To provide a vacuum seal, the spiral pressure spring 9 is surrounded by the metal bellows 12 which is connected vacuum tight to the component 23 and the seal ring 25. This connection can, for example, be provided by soldering. In the interior of the metal bellows 12, a vacuum can be provided thereby, whereas outside of the metal bellows 12, the ambient pressure is present. The seal ring 25 is clamped by the part 26, which holds the tilt bearing, to the frame part 1.

Figure 3:
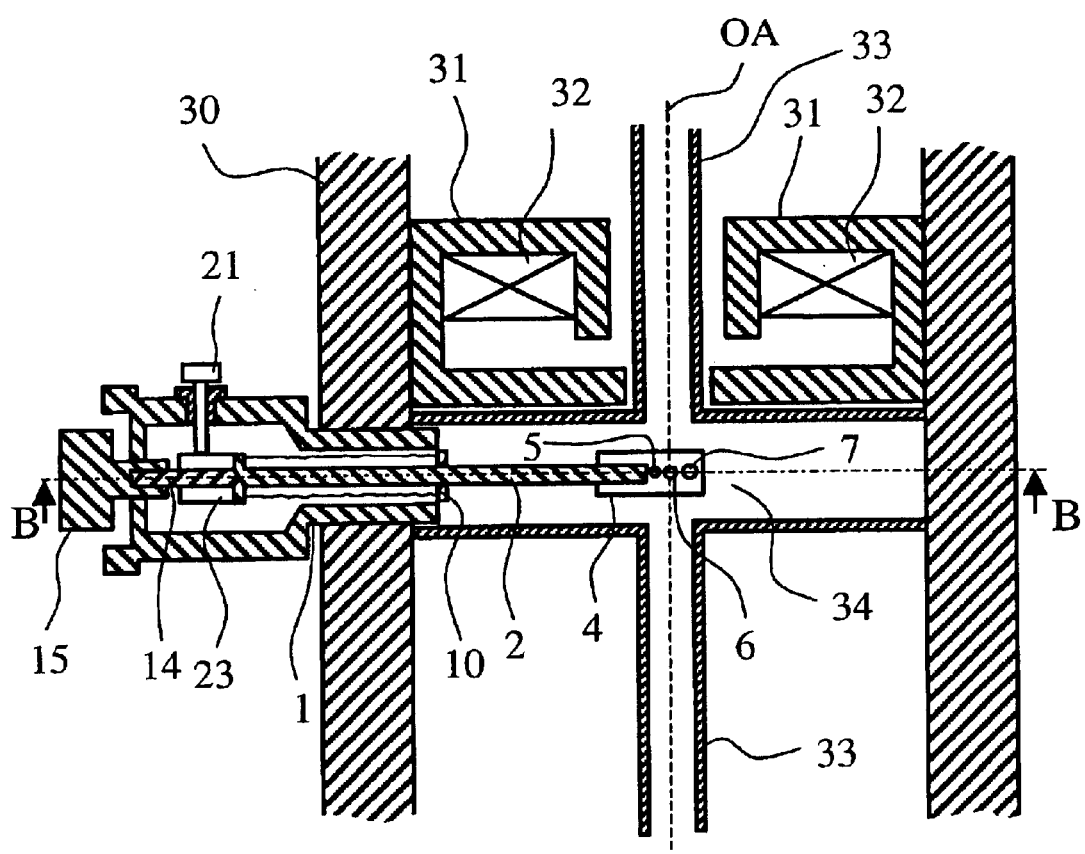

In FIG. 3, the manipulator described above is shown in combination with an electron microscope. The electron microscope has a steel column 30 which functions as a housing and in which the electron-optical components are accommodated along an optical axis OA. The electron-optical components include an electron source, condenser lenses, objective lenses, projective lenses, deflecting systems and stigmators, et cetera. In the detail shown in FIG. 3, only one of these electron-optical components is shown, namely, a magnetic lens with its poleshoe 31 and the magnetic coil 32.

The beam guide tube 33 is mounted in the interior of the steel column 30 and delimits the vacuum, which is required for the guidance of the electrons, relative to the magnetic coils 32. This beam guidance tube 33 has a vacuum breakout in the region whereat a diaphragm carrier 4 is to be arranged, that is, a widened region 34 wherein the vacuum extends up to the steel column 30. The diaphragm manipulator with its frame part 1 is accommodated in a bore through the steel column 30 in this region 34 of the vacuum breakout. By switching the above-mentioned stepped drive, one of the diaphragm openings (5, 6. 7) in the diaphragm carrier can be selectively switched into the beam path and thereafter be adjusted by rotating the operator-controlled knobs (15, 21).

With the above-described configuration of the manipulator, the heat, which is generated at the diaphragm carrier 4 by the electron beam, can be very efficiently conducted out of the vacuum region via the transfer body 2 and thereafter conducted away to the frame part 1 via the air surrounding the additional component 14 and, from the frame part 1, to the steel column 30.

At the same time, the unavoidable thermal expansion of the diaphragm carrier 4 in the direction of the connecting axis (B—B) is partially compensated by the negative expansion coefficient of the transfer body 2 in the direction of the connecting axis (B—B) or perpendicularly to the optical axis OA in FIG. 3.

Experiments have shown that the composite material used for the transfer body also shows no significant degassing in the high vacuum and therefore can also be used without difficulty in high vacuum.

The invention was explained, by way of example, with a diaphragm manipulator which is a preferred application thereof. The manipulator can, however, also be used without difficulty as a specimen manipulator or for other manipulators in that a corresponding other component to be manipulated other than a diaphragm carrier is accommodated on the transfer body 2.

The invention was explained with respect to the embodiment shown in the figures utilizing a manual manipulator by way of example. However, a configuration as a motor-driven manipulator with motor drives for the manipulator movements can also be advantageous. This makes it possible to arrange the movement devices of the manipulator close to the component to be manipulated, for example, in that, for an electron microscope, the entire manipulator is accommodated in the interior of the column. In this way, the distance between the component to be manipulated (the position of the component is simultaneously also to be held thermally stable) and the point ensuring the thermal stability is reduced. In the manual embodiment in FIGS. 1 and 2, this point is the component driven by the operator-controlled knobs (15, 21) and the screw 24. In total, a higher thermal stability is achievable with this shorter distance.

It is understood that the foregoing description is that of the preferred embodiments of the invention and that various changes and modifications may be made thereto without departing from the spirit and scope of the invention as defined in the appended claims.

What is claimed is:

1. A manipulator for manipulating a component in an optical or particle-optical apparatus, the manipulator comprising:

a spatially-fixed part;

a transfer body accommodating said component and being mounted so as to be movable relative to said spatially-fixed part;

said spatially-fixed part and said component conjointly defining a connecting axis;

said transfer body containing a thermally anisotropic composite material having a first thermal conductivity in a first direction and a second thermal conductivity in a second direction and said first thermal conductivity being higher than said second thermal conductivity; and, said composite material being disposed in said transfer body so that said first direction of said first thermal conductivity is aligned in the direction of said connecting axis, wherein said component is mounted onto said composite material of said transfer body and wherein said first thermal conductivity is larger than the thermal conductivity of copper.

2. The manipulator of claim 1, wherein said component is a specimen, diaphragm or a set of diaphragms.

3. The manipulator of claim 1, wherein said transfer body has a vanishing or negative expansion coefficient in the direction of said connecting axis (B—B).

4. The manipulator of claim 1, wherein said composite material is a fiber-reinforced graphite.

5. The manipulator of claim 4, wherein said composite material contains carbon fibers.

6. The manipulator of claim 1, wherein said first thermal conductivity is greater than 378 W/mK.

7. The manipulator of claim 1, wherein said first thermal conductivity is greater than 600 W/mK.

8. The manipulator of claim 1, wherein said second direction of said second thermal conductivity is perpendicular to said connecting axis and said second thermal conductivity corresponds to the thermal conductivity of a thermal insulator.

9. A manipulator for manipulating a component in an optical or particle-optical apparatus, the manipulator comprising:

a spatially-fixed part;

a transfer body accommodating said component and being mounted so as to be movable relative to said spatially-fixed part;

said spatially-fixed part and said component conjointly defining a connecting axis;

said transfer body containing a thermally anisotropic composite material having a first thermal conductivity in a first direction and a second thermal conductivity in a second direction and said first thermal conductivity being higher than said second thermal conductivity;

said composite material being disposed in said transfer body so that said first direction of said first thermal conductivity is aligned in the direction of said connecting axis, said transfer body having an outer end facing away from said spatially-fixed part;

said outer end having a surface inclined with respect to said connecting axis; and, said component being mounted on said outer end so as to be in surface contact with said surface of said transfer body.

10. The manipulator of claim 9, wherein said transfer body has an inner end facing away from said outer end; and, said manipulator further comprises an additional part lying in surface contact with said inner end for conducting heat to said spatially-fixed part.

11. The manipulator of claim 1, further comprising a metal sleeve surrounding said transfer body.

12. The manipulator of claim 1, further comprising a vacuum seal and said transfer body extending through said vacuum seal.

13. The manipulator of claim 12, further comprising a tilt bearing for facilitating the movement of said transfer body relative to said spatially-fixed part; and, said tilt bearing being disposed in the region of said vacuum seal.

14. An electron microscope comprising:

a housing;

a plurality of electron-optical components defining an optical axis;

a manipulator mounted in said housing for manipulating a component on said optical axis;

said manipulator including:

a spatially-fixed part;

a transfer body accommodating said component and being mounted so as to be movable relative to said spatially-fixed part;

said spatially-fixed part and said component conjointly defining a connecting axis;

said transfer body containing a thermally anisotropic composite material having a first thermal conductivity in a first direction and a second thermal conductivity in a second direction and said first thermal conductivity being higher than said second thermal conductivity;

said composite material being disposed in said transfer body so that said first direction of said first thermal conductivity is aligned in the direction of said connecting axis; and said housing comprising an interior space delineating a vacuum into which at least parts of said transfer body containing said composite material extend.

15. The manipulator of claim 9, wherein said component is a specimen, diaphragm or a set of diaphragms.

16. The manipulator of claim 9, wherein said transfer body has a vanishing or negative expansion coefficient in the direction of said connecting axis (B—B).

17. The manipulator of claim 9, wherein said composite material is a fiber-reinforced graphite.

18. The manipulator of claim 17, wherein said composite material contains carbon fibers.

19. The manipulator of claim 9, wherein said first thermal conductivity is greater than 378 W/mK.

20. The manipulator of claim 9, wherein said first thermal conductivity is greater than 600 W/mK.

21. The manipulator of claim 9, wherein said second direction of said second thermal conductivity is perpendicular to said connecting axis and said second thermal conductivity corresponds to the thermal conductivity of a thermal insulator.

22. The manipulator of claim 9, further comprising a metal sleeve surrounding said transfer body.

23. The manipulator of claim 9, further comprising a vacuum seal and said transfer body extending through said vacuum seal.

24. The manipulator of claim 23, further comprising a tilt bearing for facilitating the movement of said transfer body relative to said spatially-fixed part; and, said tilt bearing being disposed in the region of said vacuum seal.

25. A manipulator for manipulating a component in an optical or particle-optical apparatus, the manipulator comprising:

a spatially-fixed part;

a transfer body accommodating said component and being mounted so as to be movable relative to said spatially-fixed part;

said spatially-fixed part and said component conjointly defining a connecting axis;

a metal sleeve surrounding said transfer body;

a tilt bearing for facilitating the movement of said transfer body relative to said spatially-fixed part, wherein said metal sleeve extends through said tilt bearing;

said transfer body containing a thermally anisotropic composite material having a first thermal conductivity in a first direction and a second thermal conductivity in a second direction and said first thermal conductivity being higher than said second thermal conductivity; and said composite material being disposed in said transfer body so that said first direction of said first thermal conductivity is aligned in the direction of said connecting axis.

26. A manipulator for manipulating a component in an optical or particle-optical apparatus, the manipulator comprising:

a spatially-fixed part;

a rod-shaped transfer body accommodating said component and being mounted so as to be movable relative to said spatially-fixed part;

said spatially-fixed part and said component conjointly defining a connecting axis;

said transfer body consisting essentially of a thermally anisotropic carbon-fiber composite material having a first thermal conductivity in a first direction and a second thermal conductivity in a second direction and said first thermal conductivity being higher than said second thermal conductivity; and, said carbon-fiber composite material being disposed in said transfer body so that said first direction of said first thermal conductivity is aligned in the direction of said connecting axis.

27. The manipulator of claim 26, wherein said transfer body consists of a thermally anisotropic carbon-fiber composite material.

* * * * *